United States Patent [19]

Cosgrove et al.

[11] 4,390,571
[45] Jun. 28, 1983

[54] BOATLESS POINT SOURCE EVAPORATION METHOD

[75] Inventors: James F. Cosgrove, Newburgh; Gerhard P. Dahlke, Fishkill; Charles Wurms, Wappingers Falls, all of N.Y.

[73] Assignee: International Business Machines Corporation, Armonk, N.Y.

[21] Appl. No.: 278,932

[22] Filed: Jun. 30, 1981

[51] Int. Cl.³ .................. B05D 3/02; B05D 3/06; B05D 3/14; B05D 5/12
[52] U.S. Cl. .................. 427/43.1; 427/46; 427/50; 427/51; 427/91; 427/250
[58] Field of Search .......... 427/45.1, 35, 46, 50, 427/91, 51, 250, 252, 43.1

[56] References Cited

U.S. PATENT DOCUMENTS

| | | | |
|---|---|---|---|
| 3,499,785 | 3/1970 | Van Amstel | 117/107 |
| 3,860,444 | 1/1975 | Donckel | 117/107 |
| 4,061,800 | 12/1977 | Anderson | 427/46 |
| 4,183,975 | 1/1980 | Sidders | 427/50 |

OTHER PUBLICATIONS

IBM Technical Disclosure Bulletin, vol. 19, No. 10, Mar. 1977, pp. 3852–3853, "Rod Feed Control".
IBM Technical Disclosure Bulletin, vol. 18, No. 10, Mar. 1976, p. 3413, "Rod Height Control for E-Beam Evaporation System".

*Primary Examiner*—Michael R. Lusignan
*Attorney, Agent, or Firm*—Joseph E. Kieninger

[57] ABSTRACT

A vapor deposition method of coating substrates with a material involves evaporating the end of a wire or rod made of that same material. The end of the wire is inductively or radiantly heated to form a molten convex miniscus thereon which serves as the coating source for the substrates.

7 Claims, 6 Drawing Figures

BOATLESS POINT SOURCE EVAPORATION METHOD

BACKGROUND OF THE INVENTION

TECHNICAL FIELD

This invention relates to vapor deposition and more particularly to a method of evaporating a very reactive metal from a boatless point source.

DESCRIPTION OF PRIOR ART

Reactive metals such as titanium, chromium and the like are frequently used in semiconductor devices and may be deposited by a vapor deposition process. Vapor deposition methods are described in the patent to van Amstel U.S. Pat. No. 3,499,785, Donckel U.S. Pat. No. 3,860,444, Anderson U.S. Pat. No. 4,061,800 and in the IBM Technical Disclosure Bulletin, Vol. 19, No. 10, March 1977, pp. 3852-53. These processes employ crucibles or boats of tantalum, tungsten-molybdenum, boron nitride-graphite or $TiB_2$-$Al_2O_3$. These crucibles react with certain reactive metals such as chromium and titanium. Tungsten crucibles not only yield films containing traces of tungsten but they also only last for one or two runs before they fail.

In addition, the crucibles or boats need to be refilled periodically and with the advent of the high productivity load lock tool, boat or filament frequent changes become prohibitive.

Another approach described in the IBM Technical Disclosure Bulletin, Vol. 18, No. 10, March 1976, p 3413, has been to use a rod of the material to be evaporated and to heat the material with an electron beam to create a molten pool at the top of the rod for vapor deposition. This method has not been suitable, in general, because of charge level problems. Electron beam heating for vapor depositions causes spurious reflected electrons to be included in the deposited films. This in turn gives the film a higher energy or charge level which is undesirable in a film used for a memory device. The charge level causes errors in the memory device during normal computer operation.

SUMMARY OF THE INVENTION

A vapor deposition method of coating substrates with a material involves evaporating the end of a wire or rod made of that same material. The end of the wire is inductively or radiantly heated to form a molten convex miniscus thereon which serves as the coating source for the substrates. The wire may be chromium, titanium, aluminum, gold, silver, copper and the like.

Objects and features of the invention will be apparent from the following description in which the preferred embodiments are set forth in detail in conjunction with the accompanying drawings.

DESCRIPTION OF THE PREFERRED EMBODIMENT

Figure 1:
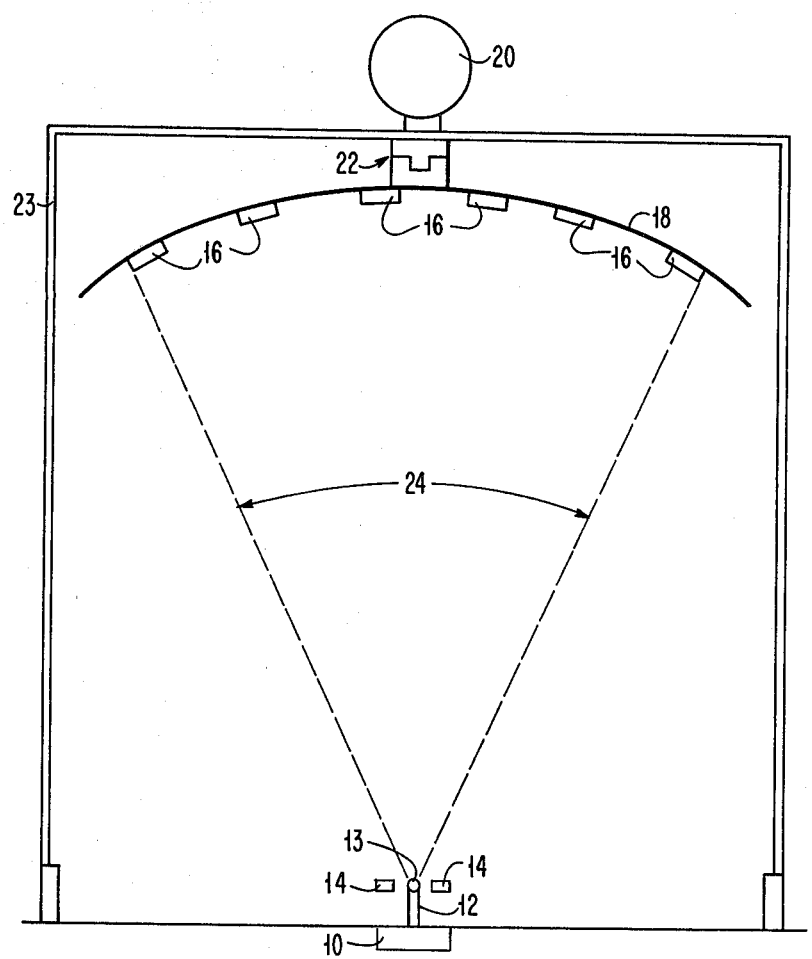
FIG. 1 is a schematic view of an apparatus used in the vapor deposition method according to the invention.
Figure 2:
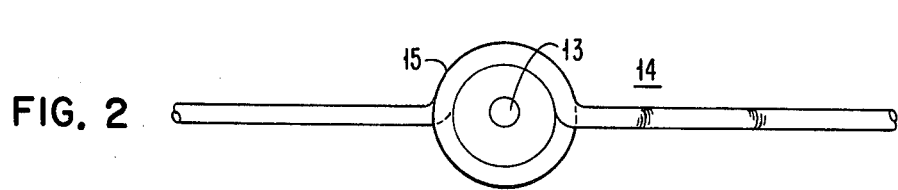
FIG. 2 is a top view plan of a heating coil and wire embodiment of FIG. 1.
Figure 3:
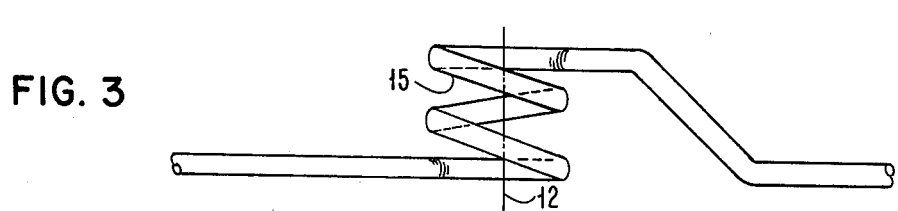
FIG. 3 is a cross-section side view of a heating coil and wire embodiment of FIG. 1.
Figure 4:
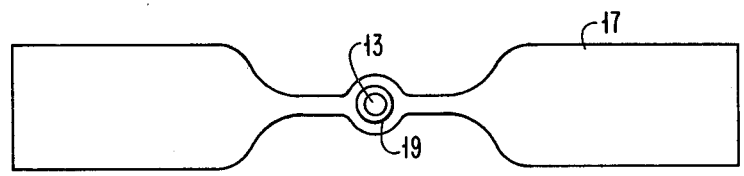
FIG. 4 is a top view plan of a resistance heating strip and wire embodiment of FIG. 1.

As shown in FIG. 1, a feed mechanism 10 provides a metal wire 12 to move vertically so that the end 13 thereof may be heated by a heating means 14. A top view of a heater 14 is shown in FIG. 2 where a resistance coil 15 surrounds the top 13 of the metal wire or rod 12. A side view of the resistance coil 15 and the wire 12 is shown in FIG. 3. The resistance coil 15 may also be in the form of a filament resistance strip 17 having an annular ring portion 19 surrounding the wire top 13 as shown in FIG. 4.

Figure 5:
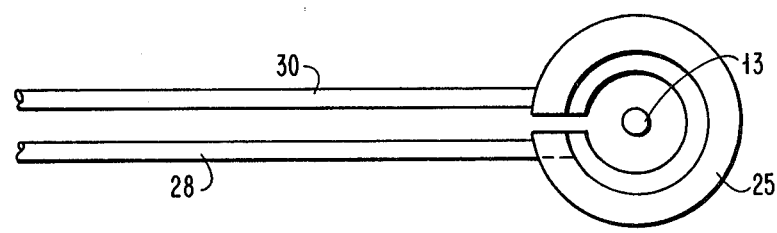
FIG. 5 is a top view plan of an inductive R.F. heating coil and wire embodiment of FIG. 1.
Figure 6:
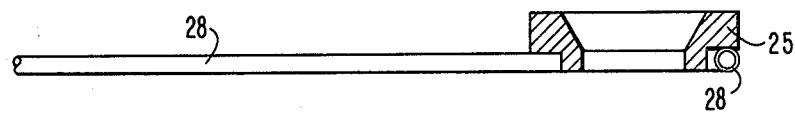
FIG. 6 is a cross-sectional view of the inductive coil shown in FIG. 5.

In addition to heating with a resistance heat coil, a radio-frequency (RF) coil 25 may be used as shown in FIGS. 5 and 6 to heat the top 13 inductively. The RF coil 25 is made of copper and silver coated for highest R.F. frequency. The connectors 28 and 30 join the coil 25 to the R.F. generator (not shown). The connectors 28 and 30 may be a continuous copper tube which is brazed to the induction coil 25.

The metal wire or rod 12 is preferably chromium, titanium or aluminum, although other metals such as gold, silver, copper, tantalum and molybdenum may be used.

Workpieces such as semiconductor wafers 16 are placed on spherical platform 18. The spherical platform 18 may be rotated by motor 20 and detached therefrom by means of decoupler 22.

The wire 12 and the substrates 16 are arranged in a closed vacuum chamber 23 so that the workpieces 16 are facing the top 13 of the wire 12 and within the vaporcloud cone 24 formed by the evaporation. The pressure in the chamber ranges from $10^{-5}$ mmHg (TORR) to $10^{-8}$ mmHg with the preferred range for chromium and titanium being $10^{-6}$ to $10^{-8}$ mmHg.

The inductive heater 14 is activated to inductively heat the end 13 of the wire 12 so that the metal is melted to form a molten spherical miniscus. When the end 13 becomes molten, it finds its lowest energy formation and spherodizes and stays on the wire. Enough heat is applied without increasing the molten mass so that the evaporation occurs from the spherical molten mass 13. One can control both the rate of evaporation from the sphere 13 and the sphere 13 size with a constant heat source by controlling the rate of feeding the wire 12 into the heat zone.

Any extraneous radiant heat generated by resistance heating can be minimized by using a water cooled shield (not shown). The addition of water cooled parabolic reflectors (not shown) about the wire end 13 focuses the radiant heat on the molten sphere 13.

EXAMPLE 1

A chromium rod (0.750″ diameter) was heated with a single turn RF coil by driving it with a 5 KW, 200–400 kHz, RF induction power supply. The vacuum chamber was then evacuated to a pressure of $10^{-7}$ mmHg. Chromium was evaporated onto a wafer at a rate of 10 A° per second when the wafer was positioned at a distance of 22″ away. There was no expulsion of large metallic particles, that is "spitting" from the chromium source.

EXAMPLE 2

The process described in Example 1 was used with a titanium rod 0.250" diameter. The evaporation rate of 1 to 2 A° per second at a distance of 22" was obtained.

EXAMPLE 3

The process described in Example 1 was used with an aluminum rod 0.250" diameter. An evaporation rate of 5 to 6 A° per second at a distance of 22" was obtained.

EXAMPLE 4

The process with a resistance strip heater using titanium wire of 0.60" diameter gave an evaporation rate of 0.5 A° per second at a distance of 16" was obtained.

This vapor deposition method has a number of advantages over the prior art vapor deposition methods. One advantage is that there is no contamination of the deposited metal such as is common when crucibles or boats are used. Another advantage over the electron beam gun evaporation process is that there are no charge level problems caused by scattered electrons which build up on the workpiece. In addition, it is not necessary to break open a closed chamber and replace a boat or filament because the feed mechanism will feed the wire as required for an extended period of time.

Although a preferred embodiment of this invention has been described, it is understood that numerous variations may be made in accordance with the principles of this invention.

What is claimed is:

1. A method of coating workpieces by vapor deposition comprising the steps of:
    placing a workpiece in an evacuated chamber substantially in line with the top of a freestanding metal mass
    heating said top of said mass without electron bombardment to form a molten spherical miniscus thereon which serves as a coating source for said workpiece, and
    evaporating metal from said molten spherical miniscus portion of said freestanding metal mass whereby said workpiece is coated with said metal.
2. A method as described in claim 1, whereby said mass is chromium.
3. A method as described in claim 1, whereby said mass is titanium.
4. A method as described in claim 1 whereby the top of said mass is inductively heated with a R.F. coil.
5. A method as described in claim 1, whereby the top of said mass is radiantly heated.
6. A method as described in claim 5 whereby the top of said mass is heated with a resistance coil.
7. A method as described in claim 5 whereby the top of said mass is heated with a resistance strip.

* * * * *